United States Patent
Cho et al.

(10) Patent No.: US 7,400,192 B2
(45) Date of Patent: Jul. 15, 2008

(54) LOW NOISE AMPLIFIER AND DIFFERENTIAL AMPLIFIER WITH VARIABLE GAIN MODE

(75) Inventors: Youngho Cho, Gyeonggi-do (KR); Bonkee Kim, Gyeonggi-do (KR); Seong-Ho Park, Gyeonggi-do (KR)

(73) Assignee: Integrant Technologies Inc., Gyeonggi-do (KR)

( * ) Notice: Subject to any disclaimer, the term of this patent is extended or adjusted under 35 U.S.C. 154(b) by 123 days.

(21) Appl. No.: 11/390,203

(22) Filed: Mar. 28, 2006

(65) Prior Publication Data

US 2006/0220736 A1    Oct. 5, 2006

(30) Foreign Application Priority Data

Mar. 29, 2005    (KR) .................. 10-2005-0025840

(51) Int. Cl.
*H03F 1/14* (2006.01)
*H03F 3/45* (2006.01)
*H03G 3/30* (2006.01)

(52) U.S. Cl. .................. 330/51; 330/136; 330/254

(58) Field of Classification Search .................. 330/51, 330/124 D, 136
See application file for complete search history.

(56) References Cited

U.S. PATENT DOCUMENTS 6,144,254 A    11/2000   Irvine et al.
6,819,171 B2 *  11/2004   Kenington .................. 330/51

* cited by examiner

*Primary Examiner*—Steven J Mottola
(74) *Attorney, Agent, or Firm*—Foley & Lardner (57) ABSTRACT

A low noise amplifier (LNA), and more particularly, to a LNA capable of making gain variable is provided. The variable gain LNA comprises a selection unit comprising a first selection cell, a second selection cell, and a third selection cell for selectively transmitting an input signal to an amplification unit to select one of the first to third selection cells in accordance with the magnitude of the input signal and an amplification unit comprising a first amplification cell for amplifying a signal applied from the first selection cell to a first gain mode and outputting, a second amplification cell for amplifying a signal applied from the second selection cell to a second gain and outputting, and a third amplification cell for amplifying a signal applied from the third selection cell to a third gain mode and outputting.

8 Claims, 5 Drawing Sheets

FIG. 1

PRIOR ART

FIG. 4

LOW NOISE AMPLIFIER AND DIFFERENTIAL AMPLIFIER WITH VARIABLE GAIN MODE

This nonprovisional application claims priority under 35 U.S.C. §119(a) on Patent Application No. 10-2005-0025840 filed in Republic of Korea on Mar. 29, 2005, the entire contents of which are hereby incorporated by reference.

BACKGROUND OF THE INVENTION

1. Field of the Invention

The present invention relates to a Low Noise Amplifier (LNA), and more particularly, to a Low Noise Amplifier (LNA) having a variable gain mode.

2. Description of the Background Art

In wireless apparatus for receiving signal such as a mobile phone and a TV set, a first stage is commonly formed of an amplifier for amplifying a received signal.

In such an amplifier, when the strength of the received signal is very small, an amplification operation having a low noise and high gain characteristic is required. However, when the strength of the received signal is relatively large, an amplification operation having a linear characteristic is required.

Therefore, in the wireless apparatus, the amplifier has two or more amplification modes in accordance with an input signal level to select one among the amplification modes.

A low noise amplifier (LNA) capable of switching a low gain state and a high gain state is disclosed in U.S. Pat. No. 6,144,254.

Figure 1:
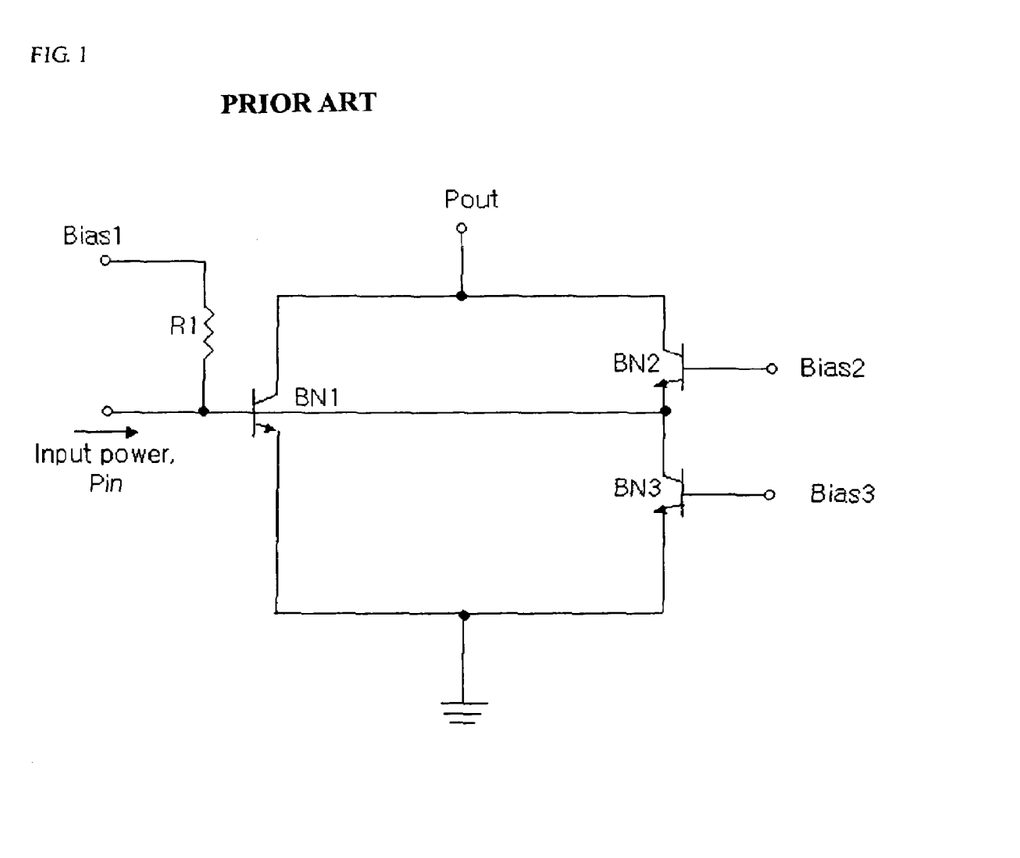
FIG. 1 is a circuit diagram illustrating a low noise amplifier (LNA) disclosed in U.S. Pat. No. 6,144,254.

FIG. 1 is a circuit diagram illustrating the LNA disclosed in the U.S. Pat. No. 6,144,254.

As illustrated in FIG. 1, the LNA comprises a common emitter type first NPN transistor BN1 that operates in the high gain state, a common base type second NPN transistor BN2 that operates in the low gain state, and a third NPN transistor BN3 and a resistor R1 for supplying a bias current to the second NPN transistor BN2.

That it, the collector of the first NPN transistor BN1 is connected to the output port Pout of the LNA, the base of the first NPN transistor BN1 is connected to the input port Pin of the LNA and a first bias input port Bias1, and the emitter of the first NPN transistor BN1 is grounded.

A resistor R1 is connected between the first bias input port Bias1 and the first NPN transistor BN1.

The collector of the second NPN transistor BN2 is connected to the output port Pout of the LNA, the base of the second NPN transistor BN2 is connected to a second bias input port Bias2, and the emitter of the second NPN transistor BN2 is connected to the input port Pin of the LNA and the collector of the third NPN transistor BN3.

The base of the third NPN transistor BN3 is connected to a third bias input port Bias3 and the emitter of the third NPN transistor BN3 is grounded.

Hereinafter, the operation of the conventional LNA will be described with reference to FIG. 1.

In the high gain state, the first bias input port Bias1 is at a high level and the second and third bias input ports Bias2 and Bias3 are at a low level.

Therefore, in the high gain state, the common emitter type first NPN transistor BN1 is activated to perform an amplification operation of high gain. In this case, the second and third NPN transistors BN2 and BN3 are turned off.

In the low gain state, the second and third bias input ports Bias2 and Bias3 are at a high level and the first bias input port Bias1 is at a low level.

Therefore, in the low gain state, the common base type second and third NPN transistors BN2 and BN3 are activated to perform an amplification operation of low gain. In this case, the first NPN transistor BN1 is turned off.

The LNA illustrated in FIG. 1 selects the high gain state and the low gain state to perform the amplification operation of the high gain or the amplification operation of the low gain in accordance with the strength of the received signal.

However, in the LNA illustrated in FIG. 1, the input port of the common emitter type first NPN transistor BN1 used in the high gain state and the input port the common base type second NPN transistor BN2 used in the low gain state, that is, the base of the common emitter type first NPN transistor BN1 and the emitter of the common base type second NPN transistor BN2 are directly connected to each other so that circuits that operate in the respective gain states have influences on each other as loads.

That is, when the LNA operates in the high gain state, the capacitance of the emitter terminal of the common base type second NPN transistor BN2 used in the low gain state operates as the load of the high gain circuit to have bad influence on the performances such as the gain, matching, and noise characteristics of the high gain state and to thus deteriorate the performance of the LNA.

Also, when the LNA operates in the low gain state, the capacitance of the base terminal of the common emitter type first NPN transistor BN1 used in the high gain state deteriorates the performance of the low gain state like in the high gain state.

This is because the impedance levels of the input terminals of the two modes that are actually the same operate as loads to each other.

SUMMARY OF THE INVENTION

Accordingly, an object of the present invention is to solve at least the problems and disadvantages of the background art.

It is an object of the present invention to provide a low noise amplifier (LNA) that operates in three amplification modes in accordance with a received signal.

It is another object of the present invention to provide a LNA whose linearity increases.

It is still another object of the present invention to provide a LNA whose power consumption is low in accordance with the magnitude of the received signal.

In order to achieve the above objects, there is provided a low noise amplifier (LNA) having a variable gain mode, the LNA comprising a selection unit comprising a first selection cell, a second selection cell, and a third selection cell for selectively transmitting an input signal to an amplification unit to select one of the first to third selection cells in accordance with the magnitude of the input signal; and an amplification unit comprising a first amplification cell for amplifying a signal applied from the first selection cell to a first gain mode and outputting, a second amplification cell for amplifying a signal applied from the second selection cell to a second gain mode and outputting, and a third amplification cell for amplifying a signal applied from the third selection cell to a third gain mode and outputting.

Here, the selection unit applies bias to one of the first to third amplification cells to activate an amplification operation.

Here, the first selection cell comprises first bias means for applying bias to operate the first amplification cell or grounding, the second selection cell comprises second bias means for applying bias to operate the second amplification cell or grounding, and the third selection cell comprises switching means for turning on or off.

Here, the first terminal of each of the first and second bias means is preferably connected to the first and second amplification cells, the second terminal is preferably connected to the bias terminal, and the third terminal is preferably grounded.

Here, the first amplification cell comprises a first amplification device having first, second, and third terminals controlling the amount of current that flows from the first terminal to the second terminal in proportion to a voltage applied to the third terminal, and a first load connected to the second terminal, the second amplification cell comprises a second amplification device having fourth, fifth, and sixth terminals controlling the amount of current that flows from the fourth terminal to the fifth terminal in proportion to a voltage applied to the sixth terminal, and a second load connected to the fifth terminal, and the third amplification cell comprises a third load.

Here, transistors are preferably further comprised in the output ports of the first and second amplification devices to improve the frequency characteristics of the first and second amplification devices.

Here, one end of the main current direction of each of the transistors is connected to the output ports of the first amplification cell and the second amplification cell, and the other end of the main current direction of each of the transistors is connected to the output port of the third amplification cell and the output port of the LNA having the variable gain mode.

Here, the output unit preferably comprises a third transistor and a second inductor, the source terminal of the third transistor is preferably connected to the output terminal of the first amplification cell of the amplification unit and the output terminal of the second amplification of the amplification unit, and the drain terminal of the third transistor is preferably connected to the second inductor and the output terminal of the third amplification cell to form an output port.

There is also provided a differential amplifier having a variable gain mode, the differential amplifier comprising a first selection unit comprising a first selection cell, a second selection cell, and a third selection cell for selectively transmitting a first input signal to an amplification unit to select one of the first to third selection cells in accordance with the magnitude of the first input signal; a second selection unit comprising a fourth selection cell, a fifth selection cell, and a sixth selection cell for selectively transmitting a second input signal to the amplification unit to select one of the fourth to sixth selection cells in accordance with the magnitude of the second input signal; a first amplification unit comprising a first amplification cell for amplifying a signal applied from the first selection cell to a first gain mode and outputting, a second amplification cell for amplifying a signal applied from the second selection cell to a second gain mode and outputting, and a third amplification cell for amplifying a signal applied from the third selection cell to a third gain mode and outputting; and a second amplification unit comprising a fourth amplification cell for amplifying a signal applied from the fourth selection cell to a fourth gain mode and outputting, a fifth amplification cell for amplifying a signal applied from the fifth selection cell to a fifth gain mode and outputting, and a sixth amplification cell for amplifying a signal applied from the sixth selection cell to a sixth gain mode and outputting.

Here, the first selection unit applies bias to one of the first to third amplification cells to activate an amplification operation, and the second selection unit applies bias to one of the fourth to sixth amplification cells to activate an amplification operation.

Here, the first selection cell comprises first bias means for applying bias to operate the first amplification cell or grounding; the second selection cell comprises second bias means for applying bias to operate the second amplification cell or grounding; the third selection cell comprises switching means for turning on or off; the fourth selection cell comprises fourth bias means for applying bias to operate the fourth amplification cell or grounding; the fifth selection cell comprises fifth bias means for applying bias to operate the fifth amplification cell or grounding; and the sixth selection cell comprises switching means for turning on or off.

A metal-oxide semiconductor field effect transistor (MOSFET) amplification device is used as the variable gain LNA according to the present invention.

The amplification device comprises the gate terminal, the source terminal, and the drain terminal.

In the MOSFET, the amount and direction of current that flows from the source terminal to the drain terminal or in the reverse direction are determined in accordance with the magnitude and polarity of a voltage applied to the gate terminal.

The amplification devices can be a bipolar junction transistor (BJT), a junction field effect transistor (JFET), a MOSFET, and a metal semiconductor field effect transistor (MESFET).

Among the above-described amplification devices, the MOSFET will be described hereinafter.

However, the present invention can be applied to all of the devices that complimentarily operate as well as the MOSFET.

Therefore, the MOSFET will be described in the present specification, however, the scope of the present invention is not limited to the MOSFET.

Other embodiments will be described in detail with reference to the detailed description of preferred embodiments and drawings.

BRIEF DESCRIPTION OF THE DRAWINGS

The present invention will be described in detail with reference to the following drawings in which like numerals refer to like elements.

DETAILED DESCRIPTION OF PREFERRED EMBODIMENTS

Preferred embodiments of the present invention will be described in a more detailed manner with reference to the drawings.

Figure 2A:
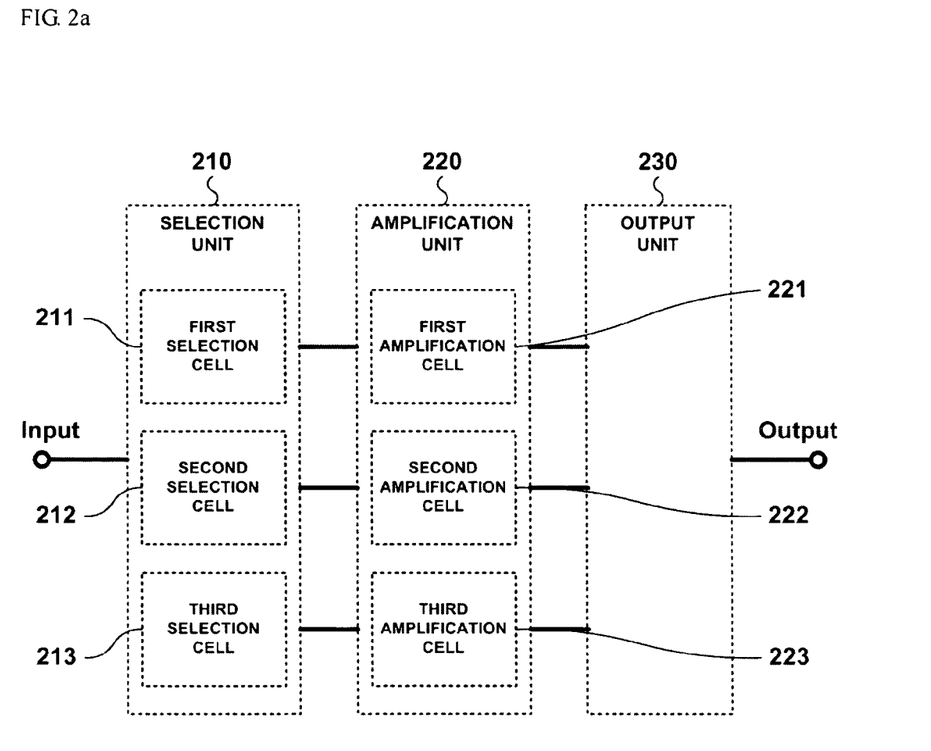
FIG. 2A is a block diagram of a variable gain LNA circuit according to an embodiment of the present invention.

FIG. 2A is a block diagram of a variable gain low noise amplifier (LNA) circuit according to the present invention.

As illustrated in FIG. 2A, the variable gain LNA comprises a selection unit 210, an amplification unit 220, and an output unit 230.

The selection unit 210 comprises a first selection cell 211, a second selection cell 212, and a third selection cell 213. In amplifying an input signal of an input port Input and outputting the input signal to an output port Output, the selection unit 210 is a circuit unit for selecting one of the first selection cell 211, the second selection cell 212, and the third selection cell 213 in accordance with gain to be amplified.

That is, the variable gain LNA is controlled so that the first selection cell 211 is selected in the case of an input signal that requires high gain, that the second selection cell 212 is selected in the case of an input signal that requires mid gain, and that the third selection cell 213 is selected in the case of an input signal that requires low gain.

The amplification unit 220 comprises a first amplification cell 221, a second amplification cell 222, and a third amplification cell 223. One of the first amplification cell 221, the second amplification cell 222, and the third amplification cell 223 is activated in accordance with the selection cell 211, 212, or 213 of the selection unit 210 so that an amplification operation is performed.

The received signal is amplified into three amplification mode in accordance with the high gain, the mid gain, and the low gain. The variable gain LNA operates differently in each region so that unnecessary power consumption is not generated and that the relatively large range of a gain band is secured.

Here, the output unit 230 in which an MOS transistor is connected to the output port of an amplification device may be added to reduce influence of interference between the output signal amplified by the first amplification cell 221 and the second amplification cell 222 and the input signal of the input port Input and to improve frequency selection of the amplification device (the MOS transistor) comprised in each of the first amplification cell 221 and the second amplification cell 222.

According to such a structure, the amplification cell is selected by the selection unit 210 so that it is possible to realize low noise and to reduce power consumption and the output unit 230 prevents the received signal of the input port Input and the received signal of the output port Output from being coupled with each other to improve stability.

Also, it is possible to increase a gain range to three bands having different gains and linearity increases toward a block having lower gain in three blocks. The LNA operates with small linearity in the high gain when a received signal is small and with large linearity in the low gain when the received signal is large.

Therefore, it is possible to increase the linearity of the LNA.

Also, since the gain range is large, when a large signal is received, the magnitude of the signal is reduced to pass the signal to the next stage so that it is possible to increase linearity of blocks that follow the LNA.

Figure 2B:
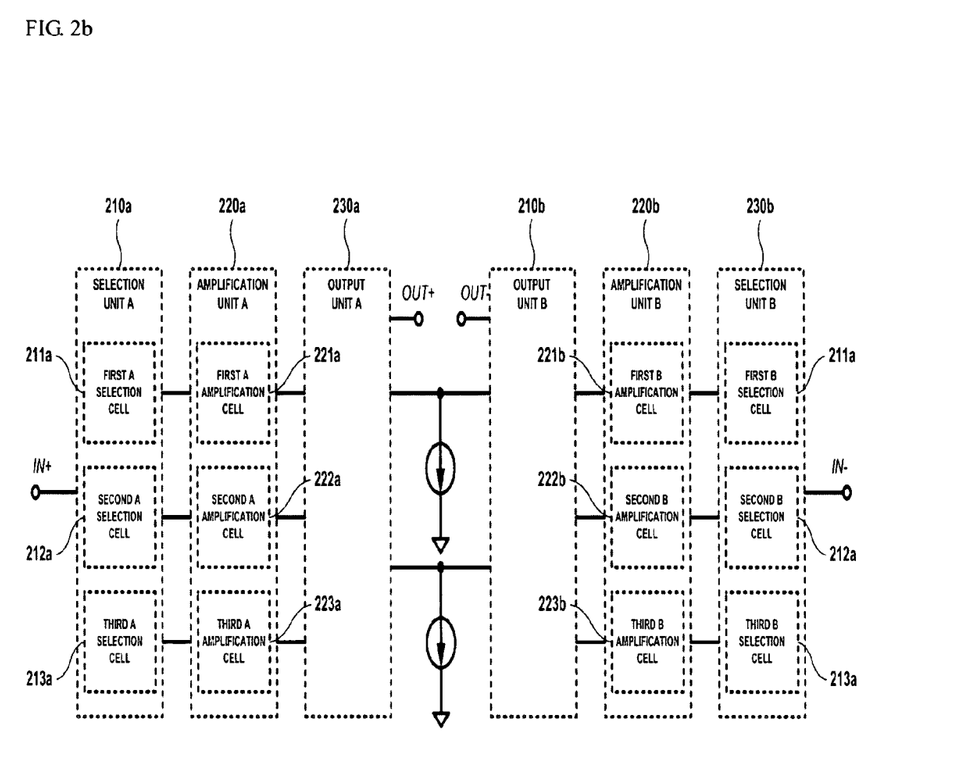
FIG. 2B is a block diagram of a variable gain differential LNA according to an embodiment of the present invention.

FIG. 2B is a block diagram of a variable gain differential LNA circuit according to an embodiment of the present invention.

As illustrated in FIG. 2B, the variable gain differential LNA comprises selection units 210a and 210b, amplification units 220a and 220b, and output units 230a and 230b.

The selection unit 210a comprises a first selection cell 211a, a second selection cell 212a, and a third selection cell 213a and selects one of the amplification cells 221a, 222a, 223a of the amplification unit 220a in accordance with a differential input signal IN+ of a positive differential input port and a differential output signal OUT+.

Also, the selection unit 210b for performing a differential operation comprises a first selection cell 211b, a second selection cell 212b, and a third selection cell 213b and selects one of the amplification cells 221b, 222b, 223b of the amplification unit 220b in accordance with a differential input signal IN− of a positive differential input port and a differential output signal OUT−.

That is, the variable gain differential LNA is controlled so that the first selection cells 211a and 211b are selected in the case of an input signal that needs to be amplified to the high gain, that the second selection cells 212a and 212b are selected in the case of an input signal that needs to be the mid gain, and that the third selection cells 213a and 213b are selected in the case of an input signal that needs to be the low gain.

The amplification unit 220a comprises a first amplification cell 221a, a second amplification cell 222a, and a third amplification cell 223a and one of the first amplification cell 221a, the second amplification cell 222a, and the third amplification cell 223a is activated by the selection of the selection unit 210 so that an amplification operation is selectively performed.

Also, the amplification unit 220b for performing a differential operation comprises a first amplification cell 221b, a second amplification cell 222b, and a third amplification cell 223b and one of the first amplification cell 221b, the second amplification cell 222b, and the third amplification cell 223b is activated by the selection of the selection unit 210b so that an amplification operation is selectively performed.

That is, the variable gain differential LNA operates such that the received signal is amplified into three amplification mode in accordance with the high gain, the mid gain, and the low gain so that unnecessary power consumption is not generated and that a gain band of a relatively large range is secured.

Figure 4:
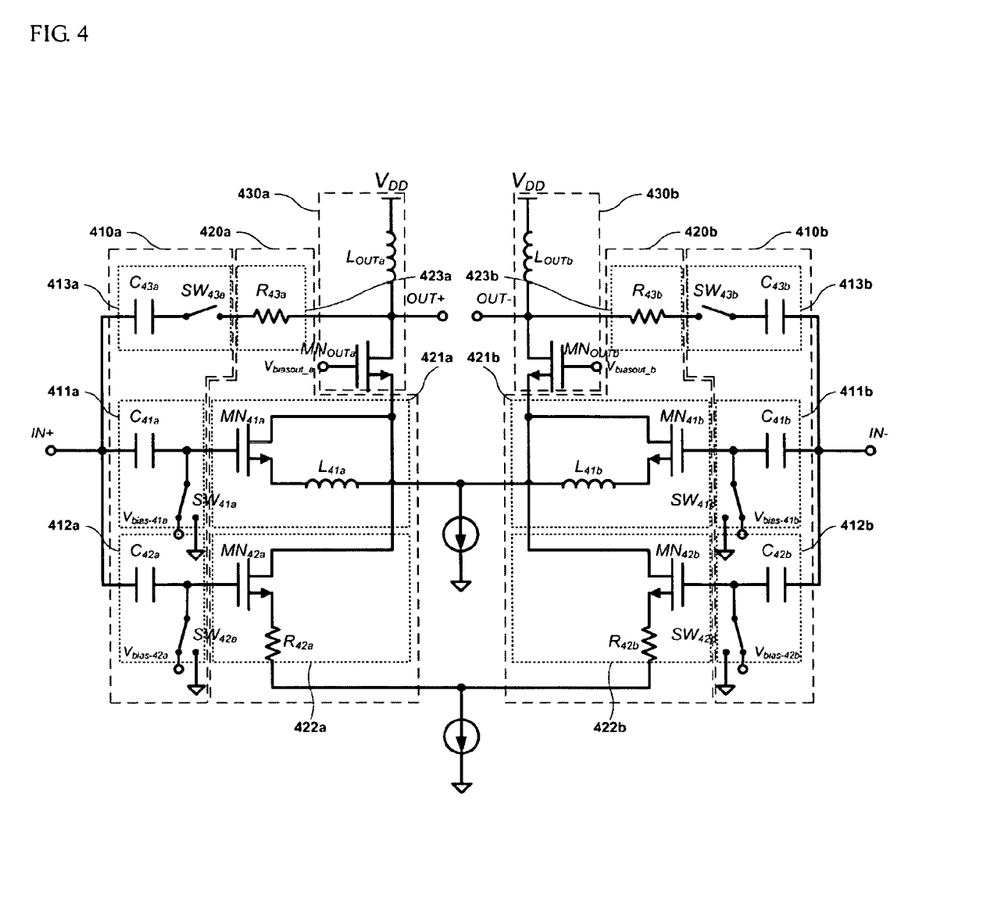
FIG. 4 is a circuit diagram of a variable gain differential LNA according to an embodiment of the present invention.

As described in FIG. 4, the output unit 430a comprises a third transistor MNout a and an output inductor Lout a to reduce influence of interference between the output signal OUT+ amplified by the first amplification cell 221 a and the second amplification cell 222a and the input signal of the input port IN+.

Also, as described in FIG. 4, the output unit 430b for performing a differential operation comprises a third transistor MNout b and an output inductor Lout b to reduce influence of interference between the output signal OUT− amplified by the first amplification cell 221b and the second amplification cell 222b and the input signal of the input port IN−.

According to such a structure, the selection units 210a and 210b can select the amplification cell so that it is possible to realize low noise and low power consumption and the output units 230a and 230b prevent the signal of the differential input ports IN− and IN+ from being coupled with the signals of the differential output port OUT− and OUT+ to improve stability.

Figure 3:
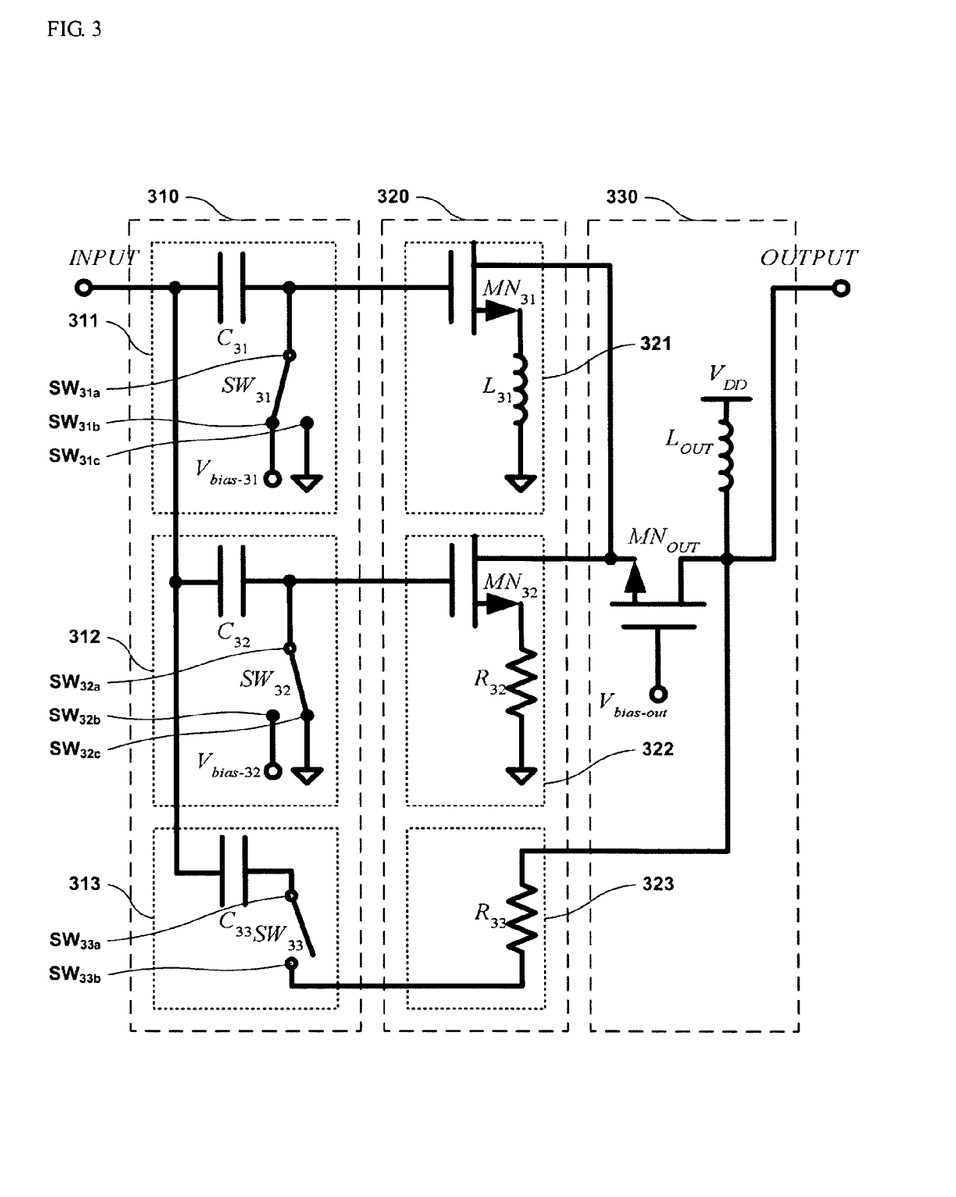
FIG. 3 is a circuit diagram of a variable gain LNA according to an embodiment of the present invention.

FIG. 3 is a circuit diagram of a variable gain LNA according to an embodiment of the present invention.

As illustrated in FIG. 3, the variable gain LNA comprises a selection unit 310, an amplification unit 320, and an output unit 330. Hereinafter, the connection relationship among them and the operations of them will be described.

The selection unit 310 comprises a first selection cell 311, a second selection cell 312, and a third selection cell 313 and selects one of the amplification cells 321, 322, 323 of the amplification unit 320 in accordance with a input signal of a input port and a output signal.

Here, the first selection cell 311 comprises a first capacitor C31 and first bias means SW31. One end of the first capacitor C31 is connected to the input port Input to supply the input signal to the first selection cell 31. The other end of the first capacitor C311 is connected to the input terminal SW31a of the first bias means SW31 and the output terminal of the first selection cell 311.

Also, the second selection cell 312 comprises a second capacitor C32 and second bias means SW32. One end of the second capacitor C32 is connected to the input port Input to supply the input signal to the second selection cell 312. The other end of the second capacitor C32 is connected to the input terminal SW32a of the second bias means SW32 and the output terminal of the second selection cell 312.

Also, the third selection cell 313 comprises a third capacitor C33 and switching means SW33 that can be turned on and off. One end of the third capacitor C33 is connected to the input port Input to supply the input signal to the third selection cell 313. The other end of the third capacitor C33 is connected to one end SW33a of the switching means SW33. The other end SW33b of the switching means SW33 is connected to the output terminal of the third selection cell 313.

The amplification unit 320 comprises a first amplification cell 321, a second amplification cell 322, and a third amplification cell 323 and one of the first amplification cell 321, the second amplification cell 322, and the third amplification cell 323 is activated by the selection of the selection unit 310 so that an amplification operation is selectively performed.

Here, the first amplification cell 321 comprises a first transistor MN31 and a first inductor L31. A first inductor L31 is connected to the source terminal of the first transistor MN31, the drain terminal of the first transistor MN31 forms an output port, and the output port of the first selection cell 311 is connected to the gate terminal of the first transistor MN31 to activate the first amplification cell 321.

Also, the second amplification cell 322 comprises a second transistor MN32 and a first resistor R32. The first resistor R32 is connected to the source terminal of the second transistor MN32, the drain terminal of the second amplification cell 322 second transistor MN32 forms the output port of the second amplification cell 322, and the output port of the second selection cell 312 is connected to the gate terminal of the second transistor MN32 to activate the second amplification cell 322.

Also, the third amplification cell 323 comprises a second resistor R33. One end of the second resistor R33 is connected to the output port of the third selection cell 313 and the other end of the second resistor R33 forms the output port of the third amplification cell 323.

The output unit 330 comprises a third transistor MNout and an output inductor Lout to reduce influence of interference between the output signal amplified by the first amplification cell 321 and the second amplification cell 322 and the input signal of the input port Input.

Here, the source terminal of the third transistor MNout is commonly connected to the output ports of the first amplification cell 321 and the second amplification cell 322. The drain terminal of the third transistor MNout is connected to the output port of the LNA. A bias voltage for activation is applied to the gate terminal of the third transistor MNout.

The operation of the LNA according to an embodiment of the present invention will be described as follows.

The variable gain LNA according to an embodiment of the present invention operates in three gain modes, that is, a high gain mode, a mid gain mode, and a low gain mode in accordance with the power level of the received signal.

When an input signal is applied, in the case where the input signal is to be amplified with the high gain, switching is performed between the input terminal SW31a and the first output terminal SW31b of the first bias means SW31 of the first selection cell 311 in accordance with a control signal so that a first bias voltage Vbias31 is applied to the input terminal SW31a.

At the same time, the input terminal SW32a of the second bias means SW32 of the second selection cell 312 is switched to be connected to the second output terminal SW32c and to be grounded and the switching means SW33 of the third selection cell 313 is turned off so that only the first amplification cell 321 is selected and that an amplification operation is performed.

That is, the input signal of the input port Input is applied only to the first amplification cell 321, is amplified, and is outputted to the output port Output of the output unit 330 when the first selection cell 311 is selected.

Also, when the input signal is to be amplified with the mid gain, switching is performed between the input terminal SW32a and the first output terminal SW32b of the first bias means SW32 of the second selection cell 312 so that a second bias voltage Vbias32 is applied to the input terminal SW32a, the input terminal SW31a of the first bias means SW31 of the first selection cell 311 is switched to be connected to the second output terminal SW31c and to be ground, and the switching means SW33 of the third selection cell 313 is turned off so that only the second amplification cell 322 is selected and that an amplification operation is performed.

That is, the input signal of the input port Input is applied only to the second amplification cell 322, is amplified, and is output to the output port Output of the output unit 330 when the second selection cell 312 is selected.

Also, when the input signal is to be amplified with the low gain (when an amplification operation is not actually required), switching is performed between the input terminal SW33a and the output terminal SW33b of the switching means SW33 of the third selection cell 313 so that shortage is performed between the input terminal SW33a and the output terminal SW33b.

The input terminal SW31a of the first bias means SW31 of the first selection cell 311 is switched to be connected to the second output terminal SW31c and to be grounded and the input terminal SW32a of the second bias means SW32 of the second selection cell 312 is switched to be connected to the second output terminal SW32c and to be grounded so that only the third amplification cell 323 is selected and that an amplification operation is performed.

That is, the input signal of the input port Input is applied only to the third amplification cell 323 and is outputted to the output port Output of the output unit 330 when the third selection cell 313 is selected.

FIG. 4 is a circuit diagram of a variable gain differential LNA according to an embodiment of the present invention.

As illustrated in FIG. 4, the differential variable gain LNA comprises selection units 410a and 410b, amplification units 420a and 420b, and output units 430a and 430b. Hereinafter, the connection relationship among them and the operations of them will be described.

The selection unit 410a comprises a first selection cell 411a, a second selection cell 412a, and a third selection cell 413a and selects one of the amplification cells 421a, 422a, 423a of the amplification unit 420a in accordance with a differential input signal IN+ of a positive differential input port and a differential output signal OUT+.

Here, the first selection cell 411a comprises a first capacitor C41a and first bias means SW41a. One end of the first capacitor C41a is connected to the positive differential input port IN+ to supply the positive differential input signal to the first selection cell 411a and the other end of the first capacitor C41a is connected to the input terminal of the first bias means SW41a and the output terminal of the first selection cell 411a.

Also, the second selection cell 412a comprises a second capacitor C42a and second bias means SW42a. One end of the second capacitor C42a is connected to the positive differential input port IN+ to supply the positive differential input signal IN+ to the second selection cell 412a and the other end of the second capacitor C42a is connected to the input terminal of the second bias means SW42a and the output terminal of the second selection cell 412a.

Also, the third selection cell 413a comprises a third capacitor C43a and switching means SW43a that can be turned on and off. One end of the third capacitor C43a is connected to the positive differential input port IN+ to supply the positive differential input signal to the third selection cell 413a, the other end of the third capacitor C43a is connected to one end of the switching means SW43a, and the other end of the switching means SW43a is connected to the output terminal of the third selection cell 413a.

Here, the selection unit 410b for performing a differential operation comprises a first selection cell 411b, a second selection cell 412b, and a third selection cell 413b and selects one of the amplification cells 421b, 422b, 423b of the amplification unit 420b in accordance with a differential input signal IN− of a positive differential input port and a differential output signal OUT−.

Here, the first selection cell 411b comprises a first capacitor C41b and first bias means SW41b. One end of the first capacitor C41b is connected to the negative differential input port IN− to supply the negative differential input signal to the first selection cell 411b and the other end of the first capacitor C41b is connected to the input terminal of the first bias means SW41b and the output terminal of the first selection cell 411b.

Also, the second selection cell 412b comprises a second capacitor C42b and second bias means SW42b. One end of the second capacitor C42b is connected to the negative differential input port IN− to supply the negative differential input signal IN− to the second selection cell 412b and the other end of the second capacitor C42b is connected to the input terminal of the second bias means SW42b and the output terminal of the second selection cell 412b.

Also, the third selection cell 413b comprises a third capacitor C43b and switching means SW43b that can be turned on and off. One end of the third capacitor C43b is connected to the negative differential input port IN− to supply the negative differential input signal to the third selection cell 413b, the other end of the third capacitor C43b is connected to one end of the switching means SW43b, and the other end of the switching means SW43b is connected to the output terminal of the third selection cell 413b.

The amplification unit 420a comprises a first amplification cell 421a, a second amplification cell 422a, and a third amplification cell 423a and one of the first amplification cell 421a, the second amplification cell 422a, and the third amplification cell 423a is activated by the selection of the selection unit 410a so that an amplification operation is selectively performed.

Here, the first amplification cell 421a comprises a first transistor MN41a and a first inductor L41a. The first inductor L41a is connected to the source terminal of the first transistor MN41a, and the drain terminal of the first transistor MN41a forms an output port, and the output port of the first selection cell 411a is connected to the gate terminal of the first transistor MN41a to activate the first amplification cell 421a.

Also, the second amplification cell 422a comprises a second transistor MN42a and a first resistor R42a. The first resistor R42a is connected to the source terminal of the second transistor MN42a, the drain terminal of the second transistor MN42a forms the output port of the second amplification cell 422a, and the output port of the second amplification cell 422a is connected to the gate terminal of the second transistor MN42a to activate the second amplification cell 422a.

Also, the third amplification cell 423a comprises a second resistor R43a. One end of the second resistor R43a is connected to the output port of the third selection cell 413a and the other end of the second resistor R43a forms the output port of the third amplification cell 423a.

Here, the amplification unit 420b for performing a differential operation comprises a first amplification cell 421b, a second amplification cell 422b, and a third amplification cell 423b and one of the first amplification cell 421b, the second amplification cell 422b, and the third amplification cell 423b is activated by the selection of the selection unit 410b so that an amplification operation is selectively performed.

Here, the first amplification cell 421b comprises a first transistor MN41b and a first inductor L41b. The first inductor L41b is connected to the source terminal of the first transistor MN41b, the drain terminal of the first transistor MN41b forms an output port, and the output port of the first selection cell 411b is connected to the gate terminal of the first transistor MN41b to activate the first amplification cell 421b.

Also, the second amplification cell 422b comprises a second transistor MN42b and a first resistor R42b. The first resistor R42b is connected to the source terminal of the second transistor MN42b, the drain terminal of the second transistor MN42b forms the output port of the second amplification cell 422b, and the output port of the second selection cell 412b is connected to the gate terminal of second transistor MN42b to activate the second amplification cell 422b.

Also, the third amplification cell 423b comprises a second resistor R43b. One end of the second resistor R43b is connected to the output port of the third selection cell 413b and the other end of the second resistor R43b forms the output port of the third amplification cell 423b.

The output unit 430a comprises a third transistor MNout a and an output inductor Lout a to reduce influence of interference between the output signal OUT+ amplified by the first amplification cell 421a and the second amplification cell 422a and the input signal of the input port IN+.

Here, the source terminal of the third transistor MNout a is commonly connected to the output ports of the first amplification cell 421a and the second amplification cell 422a, the drain terminal of the third transistor MNout a is connected to the output port of the LNA, and a bias voltage Vbiasout_a for activation is applied to the gate terminal of the third transistor MNout a.

Also, the output unit 430b for performing a differential operation comprises a third transistor MNout b and an output inductor Lout b to reduce influence of interference between the output signal OUT− amplified by the first amplification cell 421b and the second amplification cell 422b and the input signal of the input terminal IN−.

Here, the source terminal of the third transistor MNout b is commonly connected to the output ports of the first amplification cell 421b and the second amplification cell 422b, the drain terminal of the third transistor MNout b is connected to the output port of the LNA, and a bias voltage Vbiasout_b for activation is applied to the gate terminal of the third transistor MNout b.

The operation of a differential variable gain LNA according to another embodiment of the present invention is described in detail in description of the operation of the variable gain LNA described with reference to FIG. 3.

The differential variable gain LNA forms a differential circuit that receives different inputs to differentially outputting the inputs OUT− and OUT+.

The invention being thus described, it will be obvious that the same may be varied in many ways. Such variations are not to be regarded as a departure from the spirit and scope of the invention, and all such modifications as would be obvious to one skilled in the art are intended to be comprised within the scope of the following claims.

According to the present invention, the received signal is converted into three amplification modes in accordance with the magnitude of the received signal to increase the gain range of the LNA.

According to the present invention, since the amplification mode is variably selected in accordance with the gain range, it is possible to increase linearity.

According to the present invention, amplification is selectively performed so that the received signal is amplified into three amplification modes in accordance with the magnitude of the received signal so that it is possible to realize low power consumption.

What is claimed is:

1. A low noise amplifier (LNA) having a variable gain mode, the LNA comprising:
    a selection unit comprising a first selection cell, a second selection cell, and a third selection cell for selectively transmitting an input signal to an amplification unit to select one of the first to third selection cells in accordance with the magnitude of the input signal; and
    an amplification unit comprising a first amplification cell for amplifying a signal applied from the first selection cell in a first gain mode and outputting, a second amplification cell for amplifying a signal applied from the second selection cell in a second gain mode and outputting, and a third amplification cell for amplifying a signal applied from the third selection cell in a third gain mode and outputting,
    wherein the selection unit applies bias to one of the first to third amplification cells to activate an amplification operation.

2. A low noise amplifier (LNA) having a variable gain mode, the LNA comprising:
    a selection unit comprising a first selection cell, a second selection cell, and a third selection cell for selectively transmitting an input signal to an amplification unit to select one of the first to third selection cells in accordance with the magnitude of the input signal; and
    an amplification unit comprising a first amplification cell for amplifying a signal applied from the first selection cell in a first gain mode and outputting, a second amplification cell for amplifying a signal applied from the second selection cell in a second gain mode and outputting, and a third amplification cell for amplifying a signal applied from the third selection cell in a third gain mode and outputting.
    wherein the first selection cell comprises first bias means for applying bias to operate the first amplification cell or grounding,
    wherein the second selection cell comprises second bias means for applying bias to operate the second amplification cell or grounding, and
    wherein the third selection cell comprises switching means for turning on or off.

3. The LNA having a variable gain mode as claimed in claim 2,
    wherein the first amplification cell comprises a first amplification device having first, second, and third terminals controlling the amount of current that flows from the first terminal to the second terminal in proportion to a voltage applied to the third terminal, and a first load connected to the second terminal,
    wherein the second amplification cell comprises a second amplification device having fourth, fifth, and sixth terminals controlling the amount of current that flows from the fourth terminal to the fifth terminal in proportion to a voltage applied to the sixth terminal, and a second load connected to the fifth terminal, and
    wherein the third amplification cell comprises a third load.

4. The LNA having a variable gain mode as claimed in claim 3, further comprising transistors in the output ports of the first and second amplification devices to improve the frequency characteristics of the first and second amplification devices.

5. The LNA having a variable gain mode as claimed in claim 4,
    wherein one end of the main current direction of each of the transistors is connected to the output ports of the first amplification cell and the second amplification cell, and
    wherein the other end of the main current direction of each of the transistors is connected to the output port of the third amplification cell and the output port of the LNA having the variable gain mode.

6. A differential amplifier having a variable gain mode, the differential amplifier comprising:
    a first selection unit comprising a first selection cell, a second selection cell, and a third selection cell for selectively transmitting a first input signal to an amplification unit to select one of the-first to third selection cells in accordance with the magnitude of the first input signal;
    a second selection unit comprising a fourth selection cell, a fifth selection cell, and a sixth selection cell for selectively transmitting a second input signal to the amplification unit to select one of the fourth to sixth selection cells in accordance with the magnitude of the second input signal;
    a first amplification unit comprising a first amplification cell for amplifying a signal applied from the first selection cell in a first gain mode and outputting, a second amplification cell for amplifying a signal applied from the second selection cell in a second gain and outputting, and a third amplification cell for amplifying a signal applied from the third selection cell in a third gain mode and outputting; and
    a second amplification unit comprising a fourth amplification cell for amplifying a signal applied from the fourth selection cell in a fourth gain mode and outputting, a fifth amplification cell for amplifying a signal applied from the fifth selection cell in a fifth gain and outputting, and a sixth amplification cell for amplifying a signal applied from the sixth selection cell in a sixth gain mode and outputting.

7. The differential amplifier having a variable gain mode as claimed in claim 6,
    wherein the first selection unit applies bias to one of the first to third amplification cells to activate an amplification operation, and
    wherein the second selection unit applies bias to one of the fourth to sixth amplification cells to activate an amplification operation.

8. The differential amplifier having a variable gain mode as claimed in claim 6,
    wherein the first selection cell comprises first bias means for applying bias to operate the first amplification cell or grounding;

wherein the second selection cell comprises second bias means for applying bias to operate the second amplification cell or grounding;

wherein the third selection cell comprises switching means for turning on or off;

wherein the fourth selection cell comprises fourth bias means for applying bias to operate the fourth amplification cell or grounding;

wherein the fifth selection cell comprises fifth bias means for applying bias to operate the fifth amplification cell or grounding; and wherein the sixth selection cell comprises switching means for turning on or off.

* * * * *